(12) United States Patent
Yamauchi et al.

(10) Patent No.: US 6,615,399 B2
(45) Date of Patent: Sep. 2, 2003

(54) SEMICONDUCTOR DEVICE HAVING DUMMY PATTERN

(75) Inventors: Hideaki Yamauchi, Kawasaki (JP); Hisayoshi Ohba, Kawasaki (JP); Jun Watanabe, Kawasaki (JP); Kenji Hashimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 51 days.

(21) Appl. No.: 09/962,584

(22) Filed: Sep. 26, 2001

(65) Prior Publication Data

US 2002/0073391 A1 Jun. 13, 2002

(30) Foreign Application Priority Data

Dec. 7, 2000 (JP) ........................................ 2000-373374

(51) Int. Cl.[7] .............................................. G06F 17/50
(52) U.S. Cl. .............................. 716/8; 716/21; 257/207; 437/195; 438/129
(58) Field of Search ........................ 716/1–21; 257/207; 437/195; 438/129

(56) References Cited

U.S. PATENT DOCUMENTS

| | | | | |
|---|---|---|---|---|
| 5,556,805 | A | * | 9/1996 | Tanizawa et al. ............ 438/637 |
| 6,384,464 | B1 | * | 5/2002 | Shin ............................ 257/503 |
| 2002/0061608 | A1 | * | 5/2002 | Kuroda et al. ............... 438/129 |

* cited by examiner

*Primary Examiner*—Matthew S. Smith
*Assistant Examiner*—Lin Sun James
(74) *Attorney, Agent, or Firm*—Staas & Halsey LLP

(57) ABSTRACT

A semiconductor device includes a real pattern and dummy patterns in respective different coordinate systems. Using a dummy pattern in a single coordinate system does not allow an effective dummy pattern arrangement. To the contrary, if the dummy patterns in different coordinate systems are used, minimum interval requirements may be satisfied in one coordinate system while such requirements are not met in another coordinate system.

14 Claims, 9 Drawing Sheets

VIRTUAL DUMMY PATTERNS THAT SATISFY THE MINIMUM INTERVAL STANDARD, NAMELY, REAL DUMMY PATTERNS ARE PRESENT IN A CURTAILED MANNER

REAL DUMMY PATTERNS THAT SATISFY
THE MINIMUM INTERVAL STANDARD IN
REGARD TO THE WIRES ARE SELECTED
AND FILLED DENSELY 9 (SHOWN TO FACILITATE UNDERSTANDING RELATIVE POSITION, ALTHOUGH NOT GENERATED YET IN THE FIRST STEP)

7 (SHOWN TO FACILITATE UNDERSTANDING RELATIVE POSITION, ALTHOUGH NOT GENERATED YET IN THE FIRST STEP)

9 (SHOWN TO FACILITATE UNDERSTANDING RELATIVE POSITION, ALTHOUGH NOT GENERATED YET IN THE SECOND STEP)

5 (SHOWN TO FACILITATE UNDERSTANDING RELATIVE POSITION, ALTHOUGH DELETED IN THE SECOND STEP)

7 (SHOWN TO FACILITATE UNDERSTANDING RELATIVE POSITION, ALTHOUGH DELETED IN THE THIRD STEP)

5 (SHOWN TO FACILITATE UNDERSTANDING RELATIVE POSITION, ALTHOUGH DELETED IN THE THIRD STEP)

SEMICONDUCTOR DEVICE HAVING DUMMY PATTERN

BACKGROUND OF THE INVENTION

1. Field of the Invention

The present invention generally relates to semiconductor devices, and particularly relates to a method of arranging a dummy wire pattern that is prepared for processing needs, and the semiconductor device which has such dummy wire patterns.

2. Description of the Related Art

In recent years, the design ruling of semiconductor device has become finer and finer, causing difficulties in controlling a pattern width. As a parameter which controls the pattern width of wire patterns, a ratio of a resist pattern to a chip area (pattern density) is used. It has been known that a desired pattern can be formed with a satisfactory controllability by keeping the pattern density within a certain predetermined range.

When this pattern density is below the predetermined range, providing dummy wire patterns in addition to a wire pattern actually used (real wire pattern) has been practiced. By providing the dummy patterns, the pattern density is controlled to fall within the predetermined range.

Conventionally, the dummy pattern has been arranged by methods that follow.

The first method arranges dummy patterns to areas on a chip, where there is no wire present, at a certain distance from wires. By this method, the dummy pattern cannot be arranged efficiently.

The second method of solving this problem is to provide imaginary dummy patterns of a basic form (it is also called a unit dummy pattern or a virtual dummy pattern) in a lattice form at a certain interval. This method is described with reference to FIG. 1.

FIG. 1 is a plan view showing a layout. In FIG. 1, there are two wires 1 and 2 that will be actually formed (real pattern) in addition to which unit dummy patterns 3 are laid at a predetermined interval (it is equal to or larger than the minimum interval standard, which is mentioned later). The squares in dashed line represent the group of the dummy patterns that are laid as described above. At this moment, each dummy pattern 3 is virtual. When processing in a CAD system, the dummy pattern group is treated as a virtual layer.

The dummy pattern group has a single coordinate system with its origin set at the center of the chip concerned on a wafer, for example.

The virtual dummy pattern is chosen as a real dummy pattern if distances in all directions to be measured (e.g., vertically and horizontally in FIG. 1) between each dummy pattern 3 of the virtual layer and the adjacent wires 1 and 2 are determined to be equal to or larger than the predetermined minimum interval standard serving as the wiring condition. The real dummy pattern will be actually formed on a chip with the wires 1 and 2.

In arrangement of FIG. 1, when the unit dummy pattern 3 is located at the center between the wire 1 and wire 2, the distance between a dummy pattern and each of the wires 1 and 2 should be equal to or larger than the minimum interval standard. To the contrary, the unit dummy pattern 3 in the center column is not positioned at the center between the wire 1 and the wire 2, but is offset to the right as shown in FIG. 1. Due to the offset, the distance D1 of each dummy pattern 3 from the wire 2 is shorter than the minimum interval. In other words, each dummy pattern 3 in the center column is located in a position interfering with the wire 2.

Therefore, each dummy pattern 3 in the center column is not chosen as a real pattern. Of course, the dummy patterns 3 of other two columns are not chosen, either. Consequently, there will be no dummy pattern formed at all between the wire 1 and the wire 2. Therefore, the predetermined pattern density cannot be attained, causing a problem of uneven density.

The third conventional method is shown in FIG. 2. The dummy pattern group used by the method shown in FIG. 1 was arranged with the dummy patterns aligned in both column and row directions. Here, in the method shown in FIG. 2, dummy patterns are placed in a zigzag format. However, a dummy pattern group has a single coordinate system.

In FIG. 2, R1–R7 indicate each line of dummy patterns. The lines R1, R4, and R7 have the same dummy pattern arrangement (column positions of the dummy patterns are the same). The lines R2 and R5 have the same dummy pattern arrangement, having different column positions from other lines. The lines R3 and R6 have the same dummy pattern arrangement, having different column positions from other lines. That is, the same pattern is repeated every four lines.

In FIG. 2, two dummy patterns (occupying the line R2 and R5, respectively, and on the same column position) indicated by the reference number 4 satisfy the minimum interval standard, and are chosen as the real dummy patterns. Therefore, the probability in which a real dummy pattern is inserted increases.

As described above, by the conventional method shown in FIG. 2, real dummy patterns can be laid out in a curtailed manner (dotted with dummy patterns), causing a problem that the pattern density is not effectively improving.

SUMMARY OF THE INVENTION

It is a general object of the present invention to provide a semiconductor device having a dummy pattern effectively laid out in addition to real patterns for wiring and the like for realizing the desired pattern density and a method thereof, which substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by the device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides the semiconductor device having dummy patterns such that the pattern density falls within the desired range, and a method thereof.

The present invention is to provide semiconductor device, which has real patterns such as wires and dummy patterns in different coordinate systems. Using a dummy pattern in a single coordinate system does not allow an effective dummy pattern arrangement. To the contrary, if the dummy patterns in different coordinate systems are used, minimum interval requirements may be satisfied in one coordinate system while such requirements are not met in another coordinate system. Therefore, dummy patterns functioning as a whole can be effectively arranged in addition to the real patterns such as wires.

DESCRIPTION OF THE PREFERRED EMBODIMENTS

Figure 1:
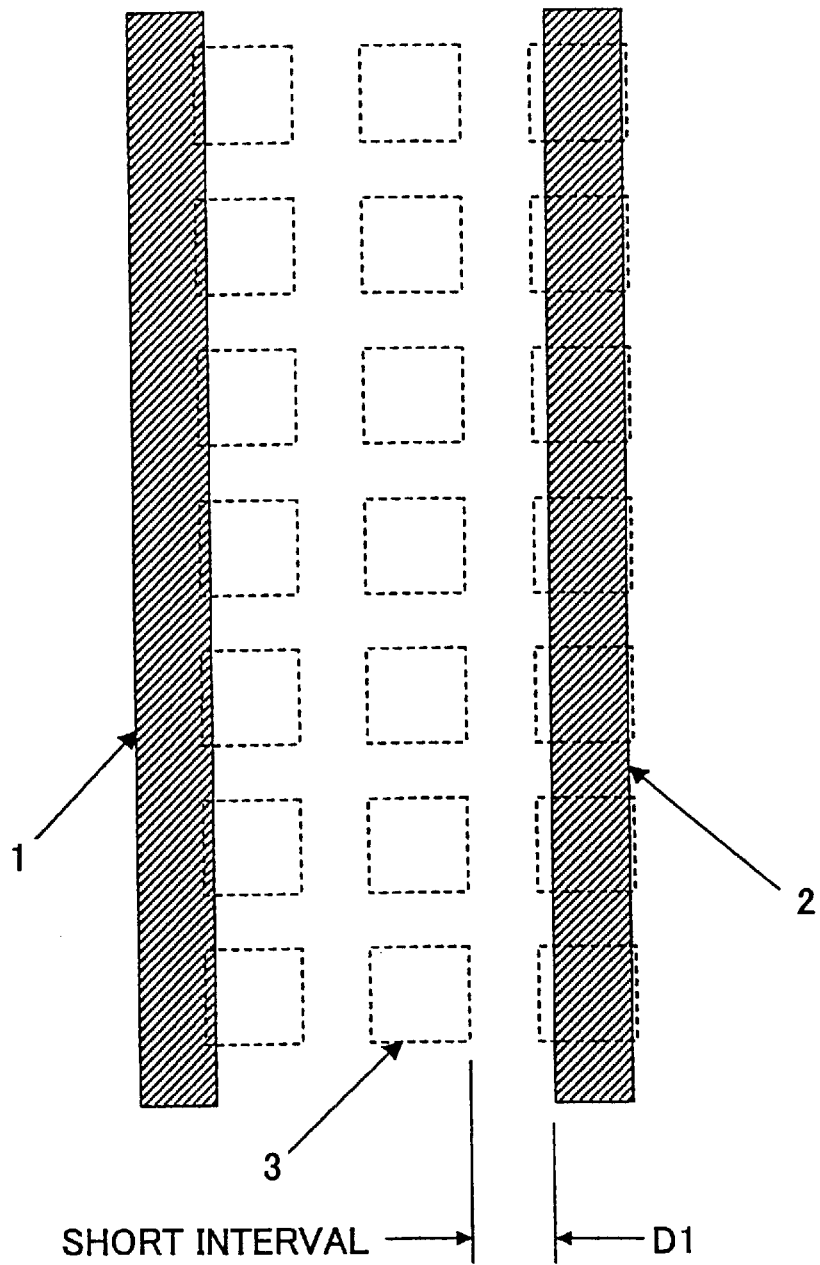
FIG. 1 is a plan view of a layout, describing the conventional dummy pattern arrangement method.

In the following, embodiments of the present invention will be described with reference to the accompanying drawings. The embodiments of the present invention described below will refer to an arbitrary layer, as an example, out of the wiring layers in multi-layer wires of LSI. FIG. 3 is a layout, describing the first embodiment of the present invention. In the first embodiment of the present invention, three virtual dummy pattern groups are used. Each pattern arrangement of the three virtual dummy pattern groups is the same as the arrangement shown in FIG. 2. However, the three virtual dummy pattern groups have different coordinate systems.

The first virtual dummy pattern group belongs to the first virtual layer, and has the dummy pattern 5. The second virtual dummy pattern group belongs to the second virtual layer, and has the dummy pattern 7. And the coordinates of the second virtual dummy pattern group have shifted to the lower right of the coordinates of the first virtual dummy pattern group so that the second virtual dummy pattern may partially overlap the first virtual dummy pattern group. The third virtual dummy pattern group belongs to the third virtual layer, and has the dummy pattern 9. And the coordinates of the third virtual dummy pattern group have shifted to the lower right of the coordinates of the second virtual dummy pattern group so that the third virtual dummy pattern may partially overlap the first and second virtual dummy pattern groups.

The first virtual layer is made the base (the origin of the coordinates being at the center of a chip). The second virtual layer and the third virtual layer are defined as the first virtual layer shifted by certain distances. Thus, the first, the second, and third virtual dummy pattern groups are generated. This enables to satisfy the minimum interval standard requirement for the virtual dummy pattern groups that have not satisfied the condition in the single coordinate system wherein the design rule was violated (that is, the minimum interval standard was not satisfied), enabling the coordinate-shifted dummy pattern groups to be placed in areas to which a dummy pattern could not otherwise be arranged.

Within the first to third virtual dummy pattern groups, the distance between adjacent virtual dummy patterns (interval) is equal to or more than the minimum interval standard. On the other hand, the distance of the dummy patterns between different virtual dummy pattern groups may be arbitrary. This is because, in a local area of about one virtual dummy pattern, only one of the first, second, and third virtual dummy pattern groups is chosen, dispensing with the need to satisfy the minimum interval standard of the virtual dummy patterns between different virtual layers. However, it is desirable that the amount of an interval between dummy patterns belonging to mutually different coordinate systems does not satisfy the minimum interval standard. Moreover, it is desirable that the coordinate systems are defined by an amount of the shift interval that makes the dummy patterns of the different coordinate systems partly overlap. Consequently, the amount of gaps of two or more coordinate systems can be set to a minute quantity to increase the probability of dummy pattern presences that satisfy the minimum interval standard between the wire and the dummy pattern for a higher pattern density.

Distances between each dummy pattern of the first through third virtual dummy pattern groups and the wires 1 and 2 are compared with the minimum interval standard for predetermined directions. Dummy patterns that have the distances equal to or larger than the minimum interval standard in all of the directions are chosen to be real dummy pattern. Here, the predetermined directions are, for example, the four directions of above, below, left and right. By considering adjacent wire positions, the comparison in the vertical directions, for example, may be omitted in the case of FIG. 3. Further, the comparison may be performed in a slanted direction.

By the above comparison processing, the virtual dummy patterns shown by the reference numbers 6, 8, and 10 are chosen to be real dummy patterns. The real dummy pattern 6 is a one that satisfies the minimum interval standard to the wire 1 and the wire 2 among the virtual dummy patterns in the first virtual dummy pattern group belonging to the first virtual layer. The real dummy patterns 8 are those that satisfy the minimum interval standard to the wire 1 and the wire 2 among the dummy patterns in the second virtual dummy pattern group belonging to the second virtual layer. The real dummy pattern 10 is a one that satisfies the minimum interval standard to the wire 1 and the wire 2 among the dummy patterns in the third virtual dummy pattern group belonging to the third virtual layer. The real dummy patterns 6, 8, and 10 have different coordinate systems, respectively.

Figure 2:
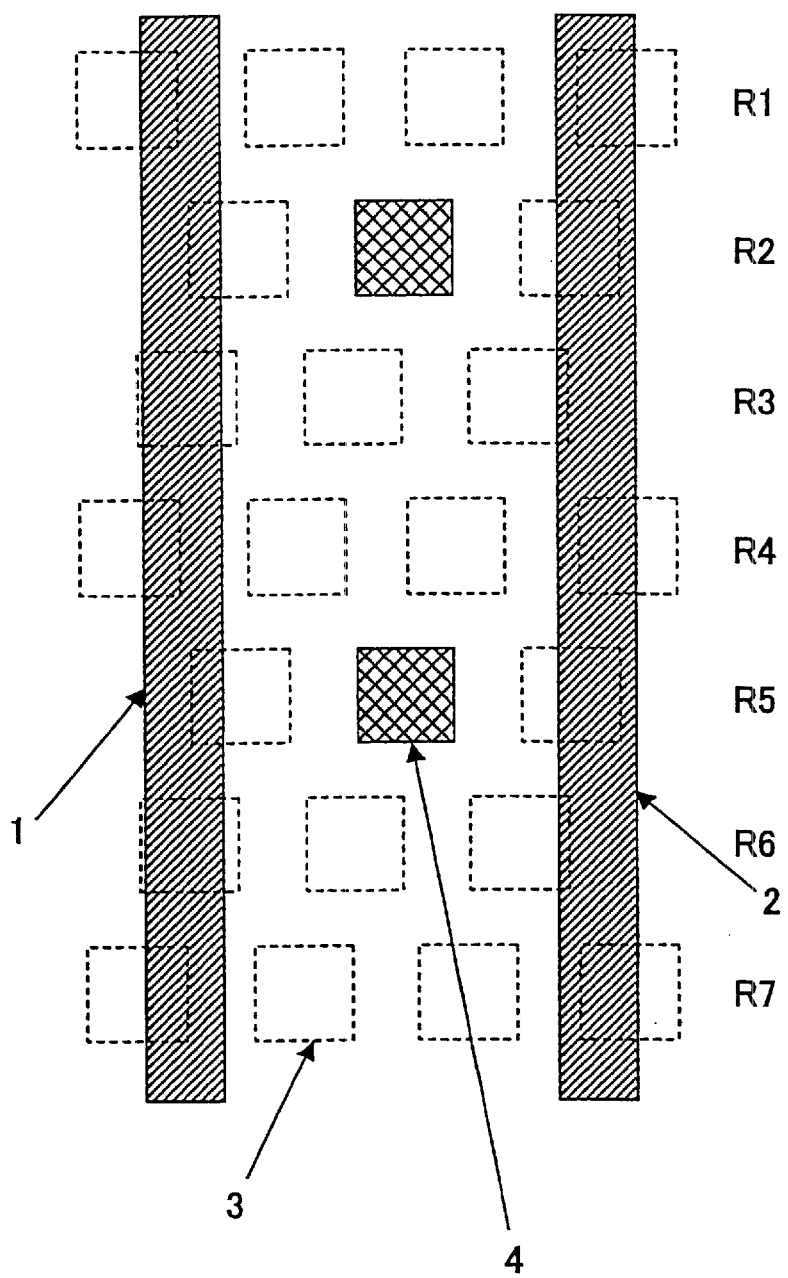
FIG. 2 is a plan view of the layout, describing another conventional dummy pattern arrangement method.
Figure 3:
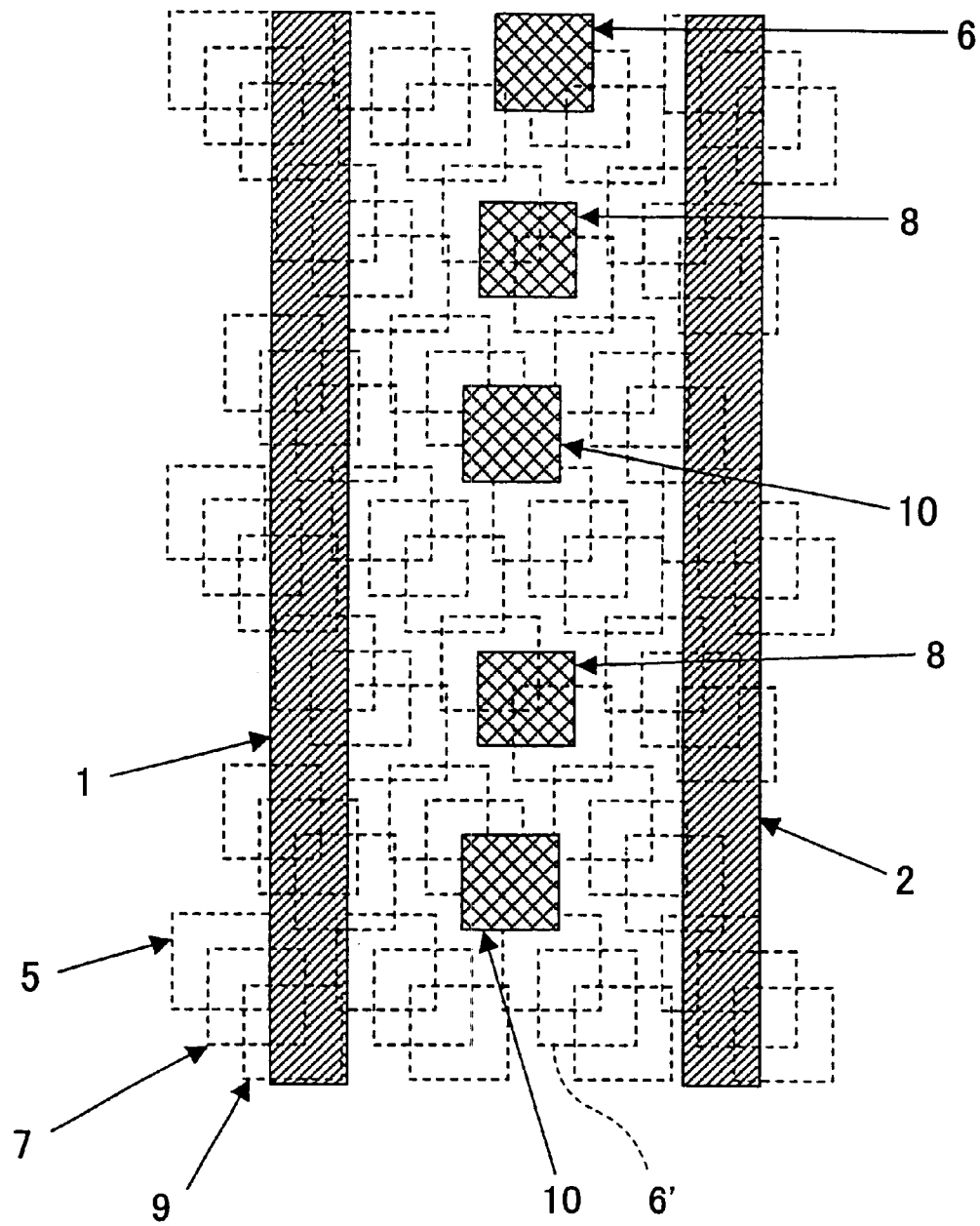
FIG. 3 is a plan view of the layout, describing the first embodiment of the present invention.

As understood by comparing FIG. 3 with FIG. 2, real dummy patterns can be arranged effectively between wire 1 and wire 2 according to the first embodiment of the present invention. That is, real dummy patterns can be surely arranged to positions where the conventional technology could not allow, thereby increasing the pattern density.

By the dummy pattern of a single coordinate system shown in FIG. 2, the arrangement as shown in FIG. 3 cannot be obtained. It is because that each dummy pattern of FIG. 2 should be apart by at least the minimum interval standard. That is, by the single coordinate system, an arrangement wherein each dummy pattern overlaps cannot be taken because of the requirement of the minimum interval standard in a single coordinate system. Therefore, the arrangement of each dummy pattern was decided uniquely, and could not obtain an optimal arrangement by choosing from a plurality of dummy patterns that are slightly shifted in a local domain of about one dummy pattern, causing a thinner pattern density as shown in FIG. 2.

Further, although a similar arrangement to FIG. 3 may be obtained locally by giving a slight shift among the rows R1, R2 and R3 of FIG. 2, it will only require a larger number of the rows to complete a row cycle after which dummy patterns come back to occupy the first column position. For example, although a real dummy pattern will be generated in the rows R1, R2, and R3, no real dummy pattern can be generated in the rows R4, R5, R6, and R7.

In above, the description was made for the virtual dummy pattern group of FIG. 2 and the virtual dummy pattern group which belongs to the same coordinate system in FIG. 3 that are aligned in one line in the row direction, and shifted in the column direction. The same discussion applies when using a virtual dummy pattern group which has a position shifted to both row and column directions.

An example of the size of each part is shown below. The sizes are set up to 2 $\mu$m square for the dummy pattern, 1 $\mu$m for the interval between virtual dummy patterns in the same virtual layer, 2 $\mu$m for the minimum interval standard between a wire and a dummy pattern, 1 $\mu$m for the amount of shift of a virtual dummy pattern in the same virtual layer (the shift amount in the row and column directions shown in FIG. 2), and 0.2 $\mu$m for the shift amount of the coordinate systems between different virtual layers. These sizes are examples. Optimal values are to be used for every semiconductor device in consideration of various conditions.

In FIG. 3, there is a case wherein two or more virtual dummy patterns belonging to different virtual layers can be adequate as a real dummy pattern, yet overlaying (interfering with) each other. In such a case, any one virtual dummy pattern is chosen as the real dummy pattern. For example, although the virtual dummy pattern 6' can be chosen as a real dummy pattern, it overlaps the real dummy pattern 10. The real dummy pattern 10 has been chosen in the example of FIG. 3. Processing in regard to this point will be described later with reference to FIG. 8.

Figure 4:
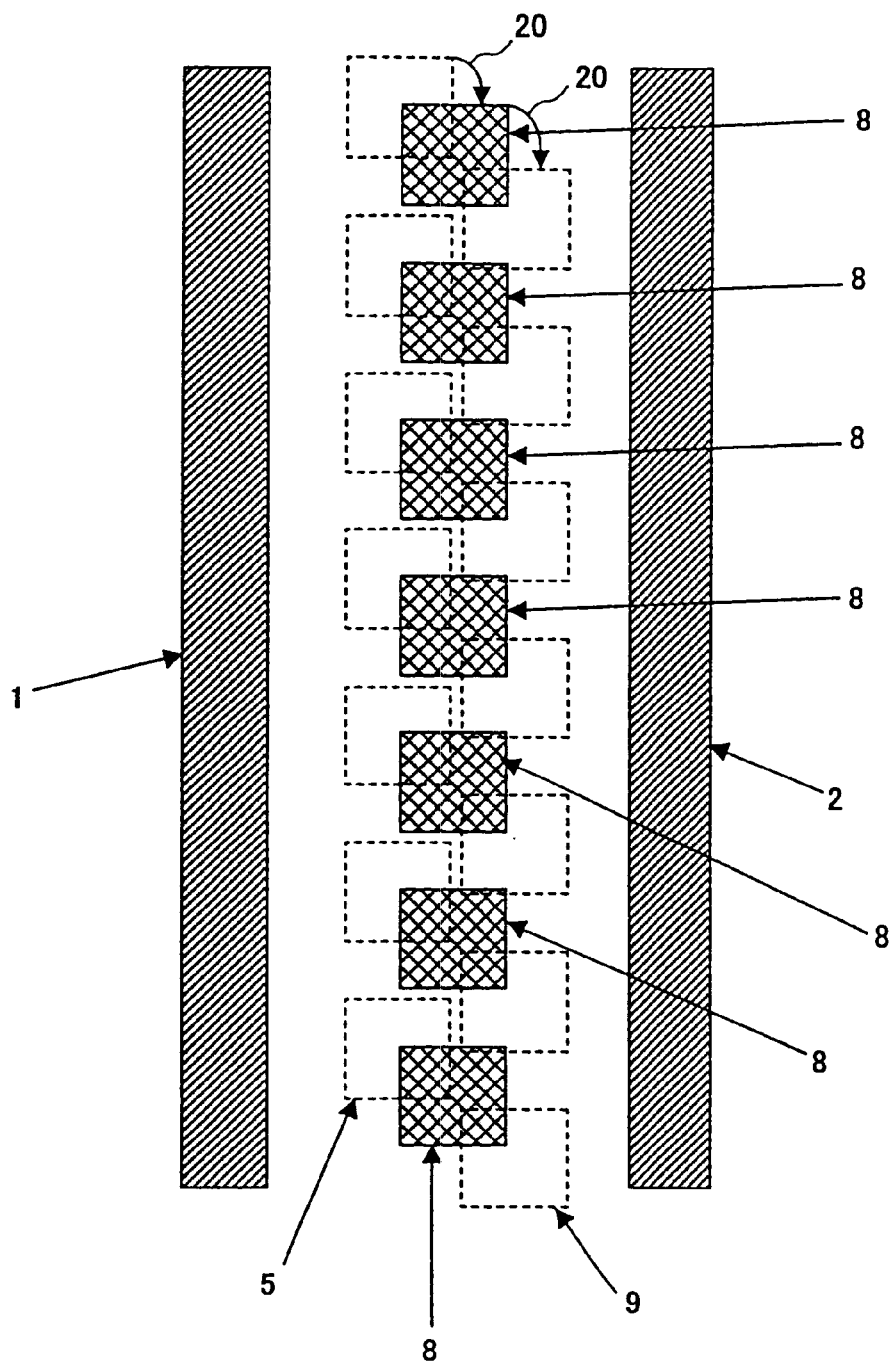
FIG. 4 is a plan view of the layout, describing the second embodiment of the present invention.

FIG. 4 is a plan view of a layout showing the second embodiment of the present invention. Same reference number will be used to an item that is same as or similar to a composition element shown in the drawings mentioned above.

A plurality of virtual dummy pattern groups used in FIG. 4 are generated by shifting the coordinate system, as the arrows 20 of FIG. 4 indicate, of the dummy pattern group in the lattice shape as shown in FIG. 1. The processing for choosing and generating a real dummy pattern from virtual dummy patterns is the same as the first embodiment as described with reference to FIG. 3. The virtual dummy patterns shown by the reference number 8 are chosen as real dummy patterns. With the conventional technology shown in FIG. 1, no dummy pattern could be arranged between the wires 1 and 2, however, the second embodiment of the present invention shown in FIG. 4 can increase the pattern density remarkably.

Figure 5:
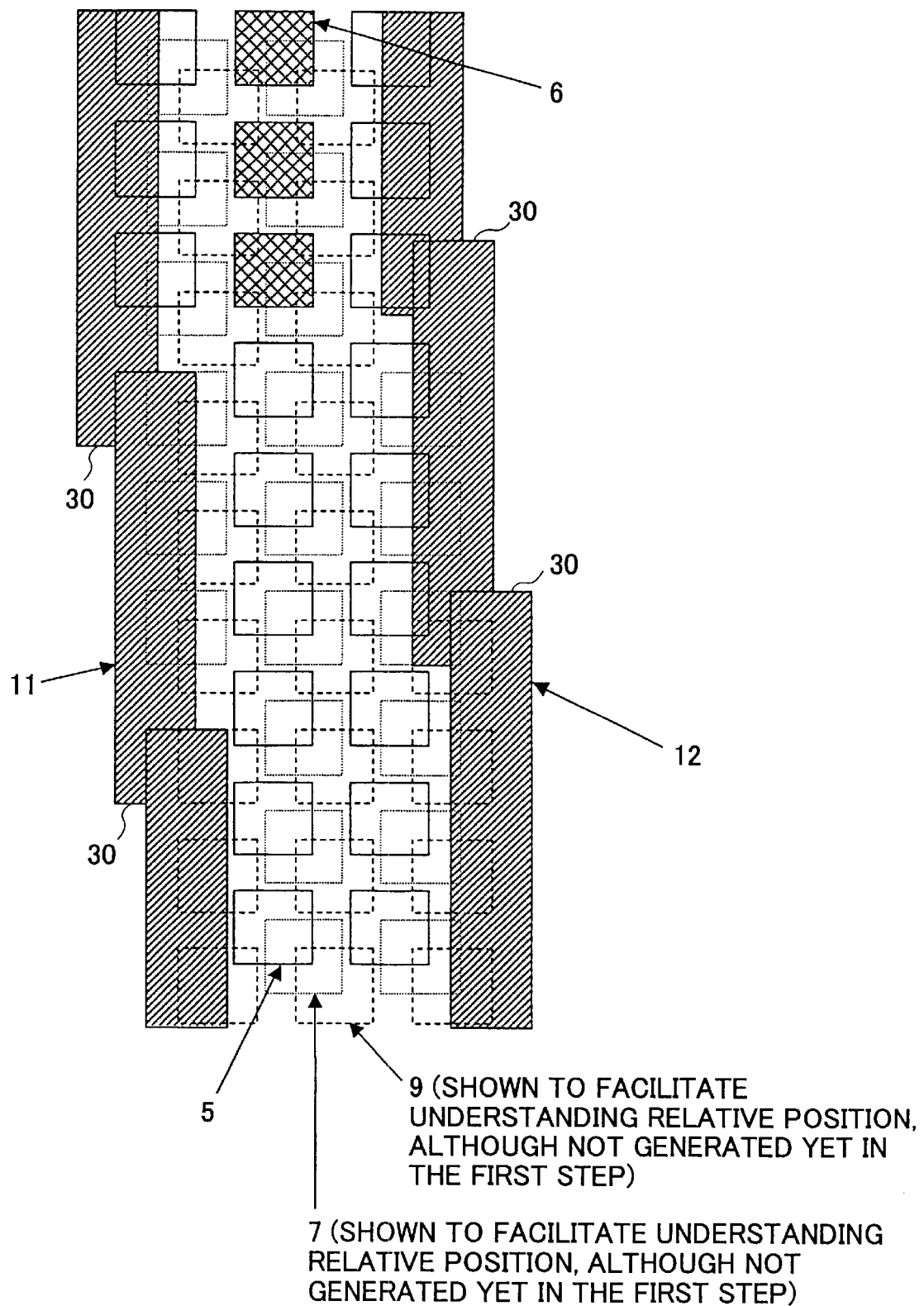
FIG. 5 is a plan view of the layout, describing the third embodiment of the present invention.
Figure 6:
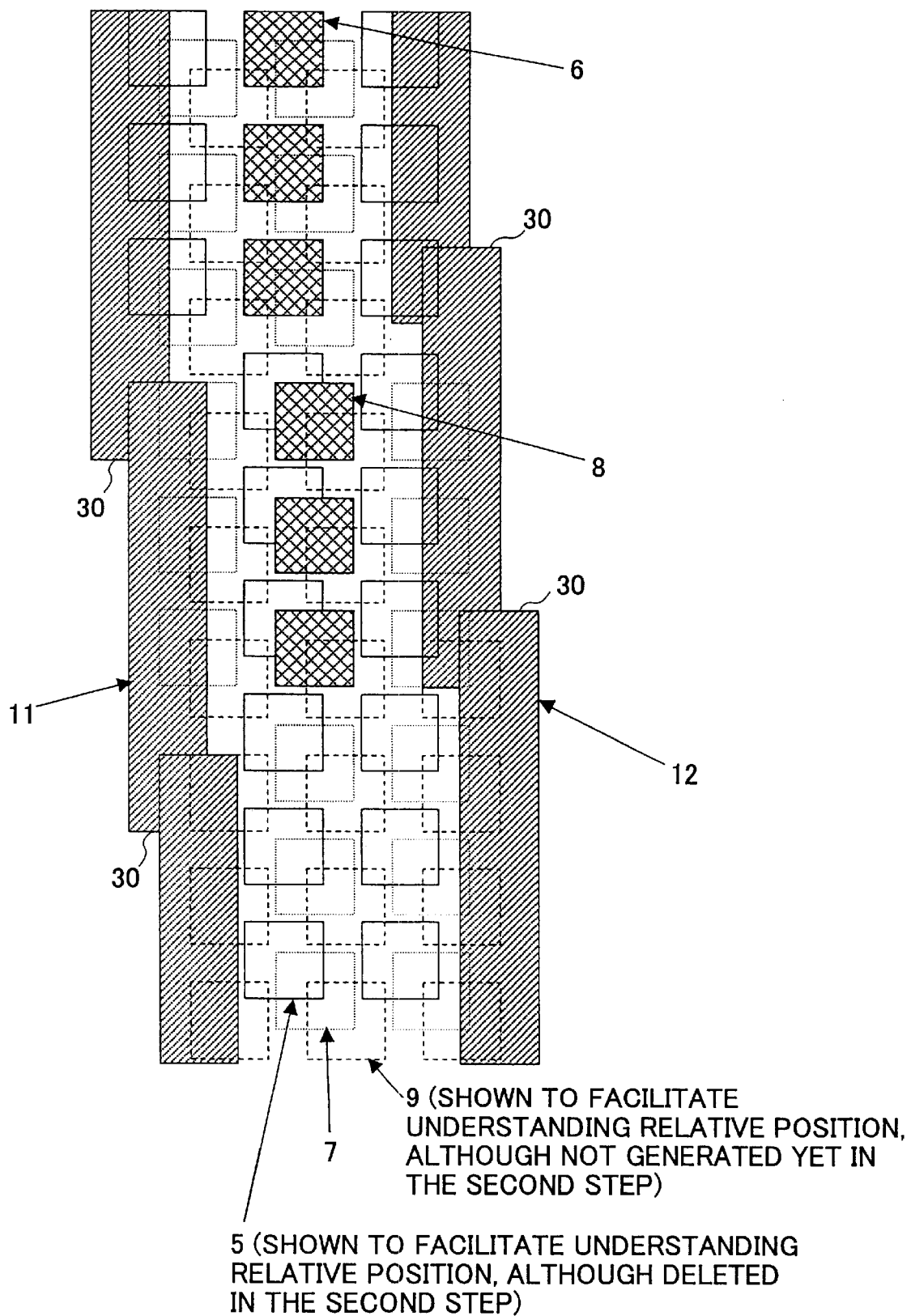
FIG. 6 is a plan view of the layout, describing the third embodiment of the present invention.
Figure 7:
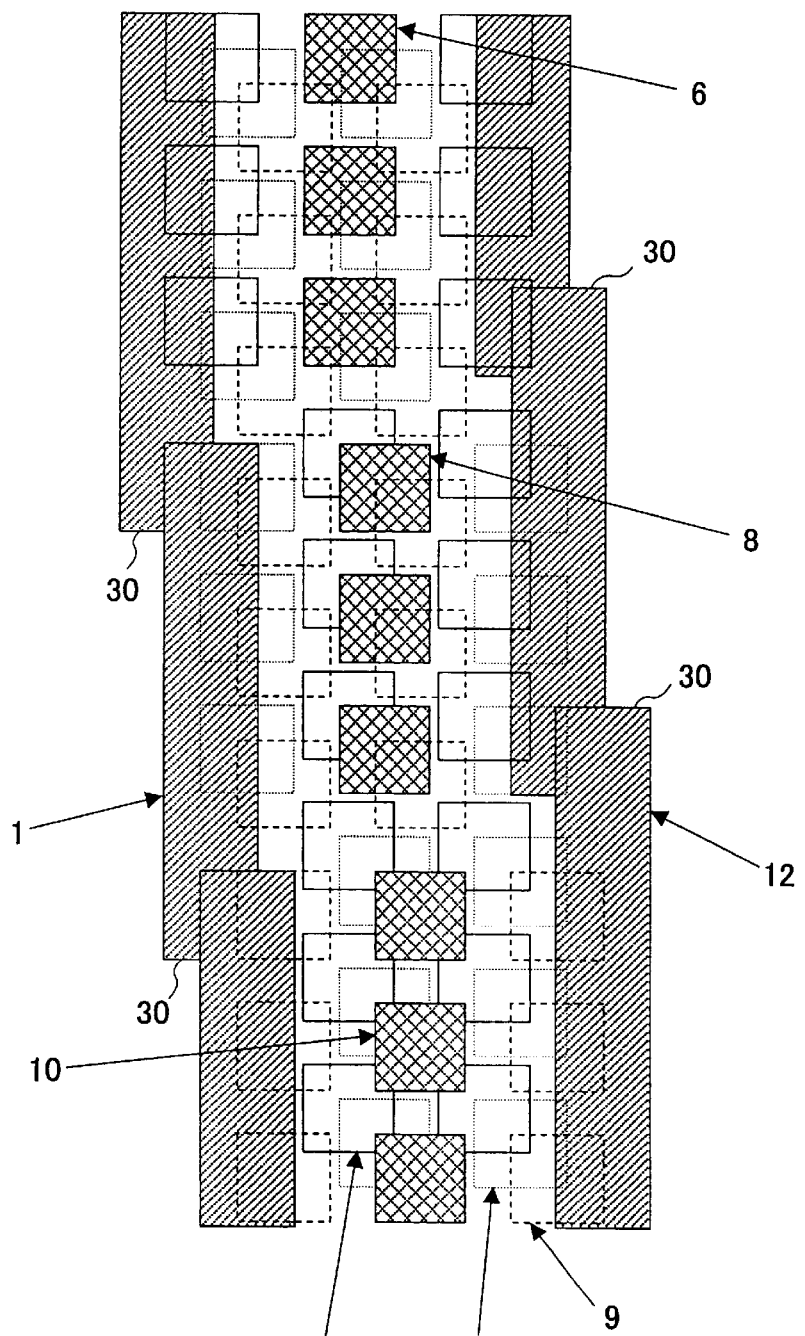
FIG. 7 is a plan view of the layout, describing the third embodiment of the present invention.
Figure 8:
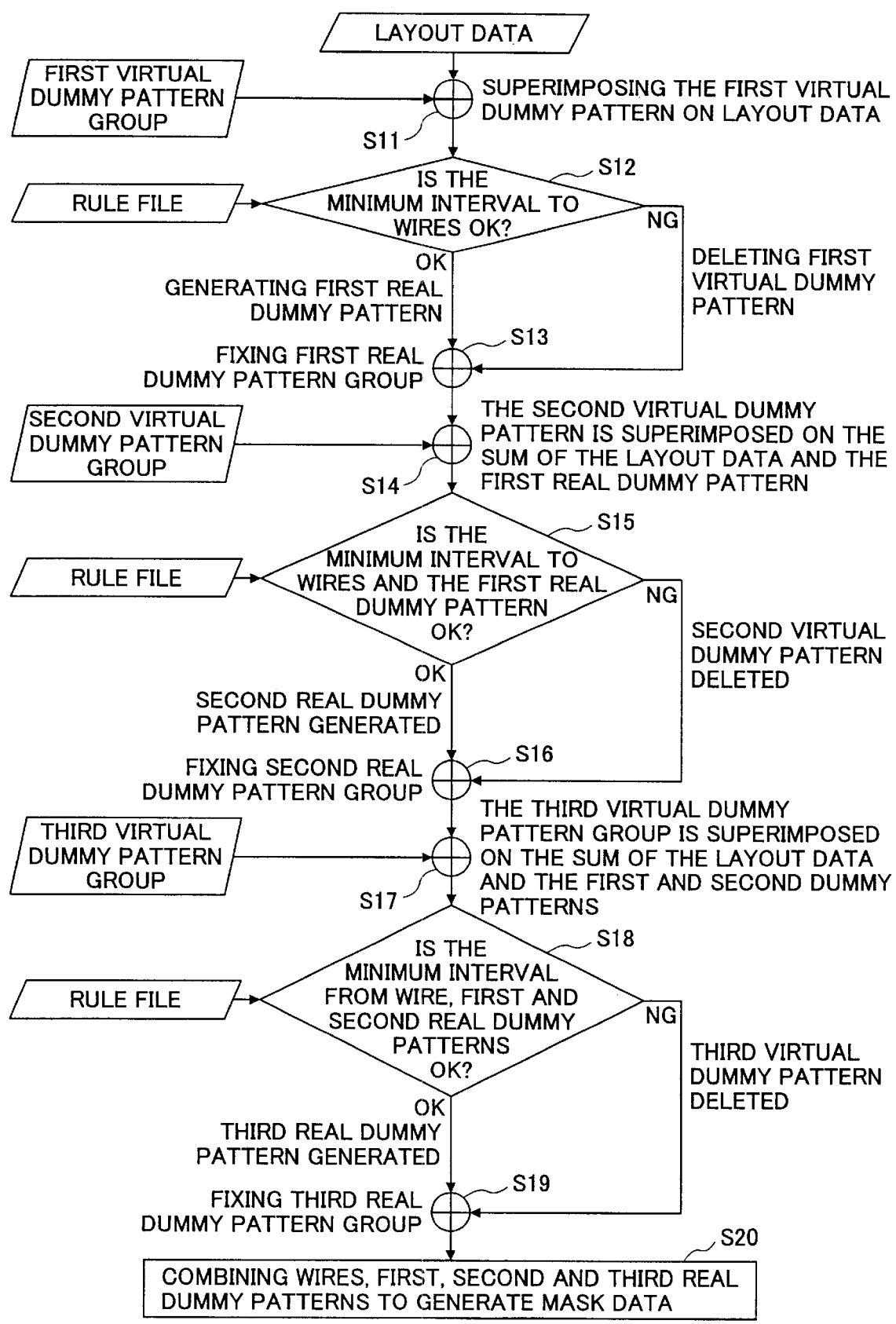
FIG. 8 is a flow chart which shows the dummy pattern arrangement method in the third embodiment of the present invention.

FIGS. 5 through 7 are plan views of layouts of the third embodiment of the present invention. Furhter, FIG. 8 is a flowchart showing arrangement method of the dummy patterns shown in FIGS. 5 through 7. In addition, this flowchart is applicable, as it is, to the first and the second embodiments. Furthermore, FIG. 9 is a block diagram showing an example of a composition of a CAD system which implements the dummy pattern arrangement method shown in FIG. 8.

As shown in FIGS. 5 through 7, each of wires 11 and 12 includes crank portions 30. According to the third embodiment of the present invention, a real dummy pattern can be surely arranged between the wires 11 and 12 which include the crank portions 30, using three virtual dummy pattern groups. The first virtual dummy pattern group includes the virtual dummy pattern 5 drawn in solid lines. The second virtual dummy pattern group includes the virtual dummy pattern 7 drawn in dotted lines. The third virtual dummy pattern group includes the virtual dummy pattern 9 drawn in dashed lines.

Now, a dummy pattern arrangement process will be described. First, the first virtual layer that includes the virtual dummy pattern 5 will be processed the result of which is as shown in FIG. 5. In a step S11 shown in FIG. 8, layout data of the wires 11 and 12 and the data of the first virtual dummy pattern group are overlayed.

Figure 9:
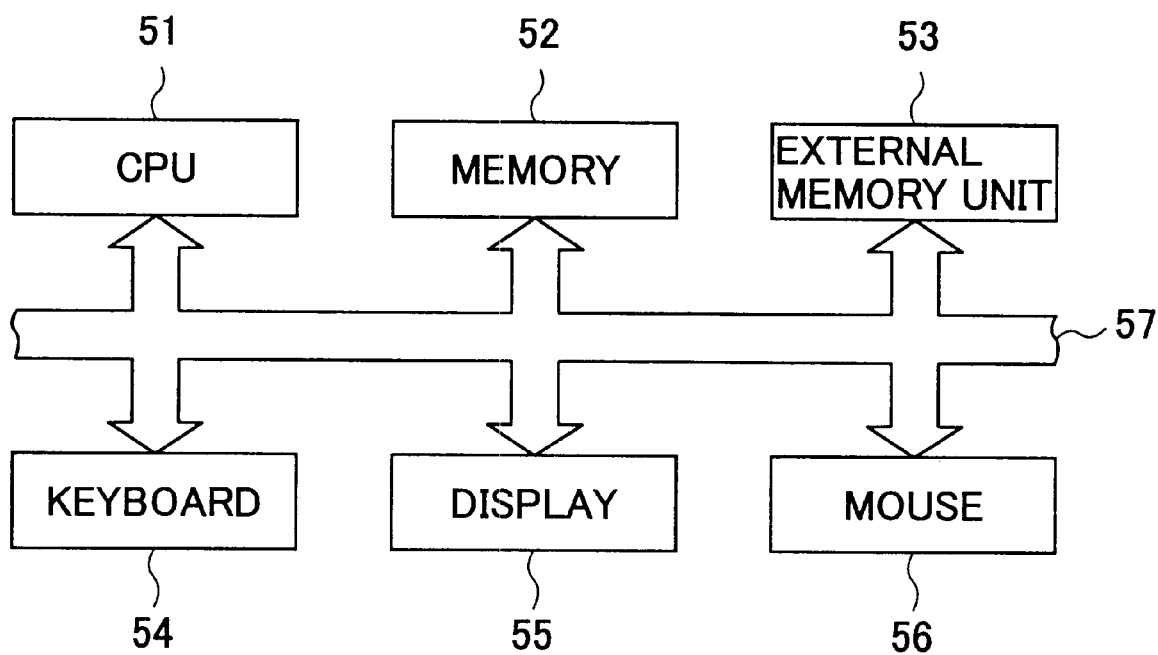
FIG. 9 is a block diagram showing an example of a CAD system composition for implementing the dummy pattern arrangement method shown in FIG. 8.

Here, a CAD system shown in FIG. 9 is described for convenience of describing. The CAD system includes a computer system and possesses as hardware resources a CPU 51, a memory 52, an external storage 53 such as a CD-ROM and a hard disk, a keyboard 54, a display 55, a mouse 56, and a bus 57 that connects these items. The process flows as shown in the flowchart in FIG. 8 with necessary data expanded in the memory 52. The memory 52 includes a RAM used as a working area of the CPU 51, ROM and the like. The layout data and the data of the first virtual dummy pattern group read in the step S11 of FIG. 8 are taken into the memory 52 from the external storage 53.

The CPU 51 overlays the layout data of the wires 11 and 12, and the data of the first virtual dummy pattern group (data of the first virtual layer) in the step S11. FIG. 5 shows all the three virtual dummy pattern groups that include the virtual dummy patterns 5, 7 and 9, respectively, to facilitate understanding the relative position of the three virtual dummy pattern groups. The last two virtual dummy pattern groups that include the virtual dummy patterns 7 and 9 are yet to be processed. Only the virtual dummy pattern group that includes the virtual dummy pattern 5 is overlayed to the wires 11 and 12 in the processing the step S11. The data expanded to the memory 52 now includes a virtual dummy pattern group that includes the virtual dummy pattern 5 and the layout data of the wires 11 and 12.

In a step S12, the CPU 51 checks whether the distance between each of the wires 11 and 12 and each virtual dummy pattern 5 satisfies the minimum interval standard, having read the data of a rule file into the memory 52. The rule file is a file that stores the data describing the minimum interval standard. The CPU 51 deletes virtual dummy patterns that do not satisfy the minimum interval standard, uses virtual dummy patterns that satisfy the minimum interval standard as the first real dummy patterns, and fixes positions of the first real dummy pattern group in a step S13. In FIG. 5, three first real dummy patterns 6 obtained by the above-mentioned processing are illustrated. This processing is performed by the CPU 51 deleting the data of the virtual dummy patterns that do not satisfy the minimum interval standard and by leaving the first real dummy patterns in the first virtual layer (it is equivalent to a file).

Next, the CPU 51 performs the second step the result of which is shown in FIG. 6. In a step S14, the layout data, the data of the second virtual dummy pattern group (data of the second virtual file), and the data of the first real dummy pattern group are overlayed. Then, the CPU 51, having read the rule file in a step S15, checks whether each virtual dummy pattern 7 satisfies the minimum interval standard in regard to distances to the wires 11 and 12, and the real dummy pattern 6 fixed in the step S13. The CPU 51 leaves the virtual dummy patterns 7 that satisfy the minimum interval standard in regard to all of the wires 11 and 12 and the real dummy patterns in the second virtual layer, deleting virtual dummy patterns that do not satisfy the minimum interval standard in a step S16. As the result, the three real dummy patterns 8 in the middle center are obtained.

Next, the CPU 51 performs the third step the result of which is as shown in FIG. 7. At a step S17, the layout data, the data of the third virtual dummy pattern group (data of the third virtual file), and the data of the first and second real dummy pattern groups are overlayed. Then, in a step S18, the CPU 51, having read the rule file, checks whether each virtual dummy pattern 9 in the third virtual dummy pattern group satisfies the minimum interval standard in regard to the wires 11 and 12, the first real dummy patterns 6 fixed in the step S13 and the second real dummy patterns 8 fixed in the step S16. The CPU 51 leaves each of the virtual dummy pattern 9 which satisfies the minimum interval standard in regard to all of the wires 11 and 12, the first and the second real dummy patterns 6 and 8 in the third virtual layer, and deletes virtual dummy patterns which do not satisfy the minimum interval standard from the third virtual layer in step S19. Consequently, three bottom real dummy patterns 10 are obtained.

Further, in a step S20, the CPU 51 overlays the layout data and the first to third virtual layers (the first to third real dummy data), and generates a wire mask data in one layer. A mask pattern is generated using this mask data, an electric conductive pattern layer is formed on a chip surface, and semiconductor device is manufactured.

In the processing of the step S15, virtual dummy patterns 7 that satisfy the minimum interval standard in regard to the wires 11 and 12 but do not satisfy in regard to the first real dummy patterns were deleted. Alternatively, the virtual dummy patterns 7 may be left, while deleting the interfering first real dummy patterns.

As mentioned above, although the embodiment using three virtual layers (three virtual dummy pattern groups) has been described, the number of the virtual layers is not limited to 3, but 2, or 4 or more of the virtual layers may be used. Moreover, the present invention includes cases in which a dummy pattern is prepared to patterns other than a wire.

According to the present invention as described above, dummy patterns in different coordinate systems are employed, thereby allowing dummy patterns in a different coordinate system may satisfy the minimum interval standard where dummy patterns in a certain coordinate system infringe the minimum interval standard. Consequently, as a whole, dummy patterns can now be placed effectively to real patterns of the wires and the like.

Further, the present invention is not limited to these embodiments, but various variations and modifications may be made without departing from the scope of the present invention.

The present application is based on Japanese priority application No. 2000-373374 filed on Dec. 7, 2000, with the Japanese Patent Office, the entire contents of which are hereby incorporated by reference.

What is claimed is:

1. A semiconductor device, comprising:
   a real pattern; and
   dummy patterns in respective different coordinate systems, wherein the different coordinate systems are such that the dummy patterns of at least adjacent coordinate systems partially overlap.

2. A semiconductor device, comprising:
   a real pattern; and
   dummy patterns in respective different coordinate systems, wherein:
   said dummy patterns in the different coordinate systems have an identical shape with each other, and
   the different coordinate systems are such that the dummy patterns of at least adjacent coordinate systems partially overlap.

3. A semiconductor device, comprising:
   a real pattern; and
   dummy patterns in respective different coordinate systems, wherein:
   some of said dummy patterns in the different coordinate systems, other than a given one of said dummy patterns, have coordinates shifted from the given one of said dummy patterns, and
   the different coordinate systems are such that the dummy patterns of at least adjacent coordinate systems partially overlap.

4. A semiconductor device, comprising:
   a real pattern; and
   dummy patterns in respective different coordinate systems, wherein the different coordinate systems are such that each of said dummy patterns has a portion thereof that overlaps another dummy pattern.

5. A semiconductor device, comprising:
   a real pattern; and
   dummy patterns in respective different coordinate systems, wherein:
   said dummy patterns in the different coordinate systems have an identical shape with each other, and
   the different coordinate systems are such that each of said dummy patterns has a portion thereof that overlaps another dummy pattern.

6. A semiconductor device, comprising:
   a real pattern; and
   dummy patterns in respective different coordinate systems, wherein:
   some of said dummy patterns in the different coordinate systems, other than a given one of said dummy patterns, have coordinates shifted from the given one of said dummy patterns, and
   the different coordinate systems are such that each of said dummy patterns has a portion thereof that overlaps another dummy pattern.

7. A method of arranging dummy patterns, comprising:
   a first step of comparing dummy patterns with a real pattern in regard to whether relative positions thereof satisfy a predetermined condition;
   a second step of selecting, as a real dummy pattern, one of the dummy patterns which satisfies said predetermined condition; and
   a third step of shifting coordinates of the dummy patterns and returning to said first step.

8. A method of arranging dummy patterns, comprising:
   a first step of comparing dummy patterns in respective different coordinate systems with a real pattern in regard to whether relative positions thereof satisfy a predetermined condition; and a second step of selecting, as a real dummy pattern, one of the dummy patterns which satisfies said predetermined condition, wherein the different coordinate systems are such that the dummy patterns of at least adjacent coordinate systems partially overlap.

9. The method as claimed in claim 7, wherein if there are a plurality of real dummy patterns that overlap at said second step, one of the real dummy patterns is selected as said real dummy pattern.

10. The method as claimed in claim 8, wherein if there are a plurality of real dummy patterns that overlap at said second step, one of the real dummy patterns is selected as said real dummy pattern.

11. A method of producing a semiconductor device, comprising a step of making a semiconductor device that includes a real pattern and a real dummy pattern selected by the method of claim 7.

12. A method of producing a semiconductor device, comprising a step of making a semiconductor device that includes a real pattern and a real dummy pattern selected by the method of claim 8.

13. A CAD system, comprising:

a memory; and a processing unit which operates based on data stored in said memory so as to automatically generate a real dummy pattern by the method of claim 7.

14. A CAD system, comprising:

a memory; and a processing unit which operates based on data stored in said memory so as to automatically generate a real dummy pattern by the method of claim 8.

* * * * *